(12) United States Patent
Pasotti et al.

(10) Patent No.: US 9,324,399 B2
(45) Date of Patent: Apr. 26, 2016

(54) SYSTEM AND METHOD FOR A LEVEL SHIFTING DECODER

(71) Applicants: STMicroelectronics International N.V., Amsterdam (NL); STMicroelectronics S.r.l, Agrate Brianza (IT)

(72) Inventors: Marco Pasotti, Travaco'Siccomario (IT); Abhishek Lal, Faridabad (IN); Rajat Kulshrestha, Noida (IN)

(73) Assignees: STMICROELECTRONICS INTERNATIONAL NV, Amsterdam (NL); STMICROELECTRONICS S.R.L., Agrate Brianza (IT)

( * ) Notice: Subject to any disclaimer, the term of this patent is extended or adjusted under 35 U.S.C. 154(b) by 186 days.

(21) Appl. No.: 14/183,225

(22) Filed: Feb. 18, 2014

(65) Prior Publication Data

US 2015/0235686 A1    Aug. 20, 2015

(51) Int. Cl.
*G11C 8/10* (2006.01)
*G11C 8/08* (2006.01)
*G11C 8/06* (2006.01)
*G11C 16/12* (2006.01)

(52) U.S. Cl.
CPC .. *G11C 8/10* (2013.01); *G11C 8/06* (2013.01); *G11C 8/08* (2013.01); *G11C 16/12* (2013.01)

(58) Field of Classification Search
CPC ............... G11C 8/06; G11C 8/08; G11C 8/10
USPC ................... 326/80, 105; 365/189.11, 230.06
See application file for complete search history.

(56) References Cited

U.S. PATENT DOCUMENTS 8,427,889 B2 *   4/2013   Chou ................. G11C 11/4085
                                                   365/189.11
9,117,547 B2 *   8/2015   Barth, Jr. ........... G11C 11/4085

* cited by examiner

*Primary Examiner* — Daniel D Chang
(74) *Attorney, Agent, or Firm* — Slater & Matsil, L.L.P.

(57) ABSTRACT

According to various embodiments described herein, a circuit includes a decode logic circuit, a buffer coupled to the decode logic, a positive level shifter with an input coupled to receive address signals and an output coupled to the buffer, and a negative level shifter with an input coupled to receive the address signals and an output coupled to the buffer.

29 Claims, 8 Drawing Sheets

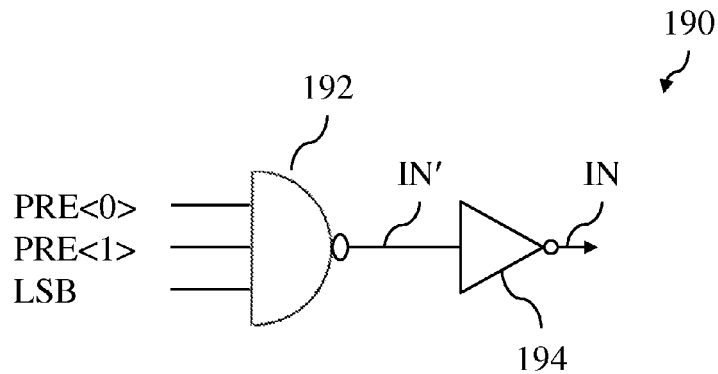

*Figure 7*

| | VX | VNEG | VDD | CTL1 | CTL2 | SP | GP | WL |
|---|---|---|---|---|---|---|---|---|
| Read/Program | $V_{prog}$ | $V_{ref}$ | $V_{sup}$ | $V_{ref}$ | $V_{sup}$ | $V_{prog}$ | $V_{prog}$ | $V_{prog}$ |
| Read/Program (Non-Selected) | $V_{prog}$ | $V_{ref}$ | $V_{sup}$ | $V_{ref}$ | $V_{sup}$ | $V_{ref}$ | $V_{ref}$ | $V_{ref}$ |
| Verify | $V_{veri\_s}$ | $V_{veri\_n}$ | $V_{sup}$ | $V_{sup}$ | $V_{veri\_n}$ | $V_{veri\_s}$ | $V_{veri\_s}$ | $V_{veri\_s}$ |
| Verifiy (Non-Selected) | $V_{veri\_s}$ | $V_{veri\_n}$ | $V_{sup}$ | $V_{sup}$ | $V_{veri\_n}$ | $V_{veri\_n}$ | $V_{veri\_n}$ | $V_{veri\_n}$ |
| Erase | $V_{ref}$ | $V_{erase}$ | $V_{ref}$ | $V_{erase}$ | $V_{erase}$ | $V_{erase}$ | $V_{erase}$ | $V_{erase}$ |

*Figure 8*

SYSTEM AND METHOD FOR A LEVEL SHIFTING DECODER

TECHNICAL FIELD

The present invention relates generally to memory systems, and, in particular embodiments, to a system and method for line decoding in a memory.

BACKGROUND

Most types of computing systems require memory, e.g. an element with the ability to store data or instructions. In some considerations, memory can be divided into two broad categories: volatile and non-volatile memory. Both volatile and non-volatile memories alike are fundamental in most computing systems. Example families of memories common in computing systems include static random access memory (SRAM), dynamic random access memory (DRAM), electrically erasable programmable read-only memory (EEPROM), NOR flash memory, NAND flash memory, phase change memory (PCM), hard drive memory, and even compact disc read-only memory (CD-ROM).

In a very general sense, computing systems perform operations on data values. Data values may range from bits of compiled program code for performing some specific operations to pixel values for pictures stored on cell phone or computer. Regardless of the data values in question, computing systems generally need data values to operate. Memories provide a way to make data values accessible to processing components.

Also in a general sense, memory systems usually support basic operations including read, write, and erase. Some systems are read only. A read operation obtains a data value stored at a particular address in the memory system. A write operation puts a new value in a particular address in the memory system. An erase operation resets the value at a particular address to an erased value, such as 1 or 0 in different cases. Because memory systems come in numerous different sizes or capacities, a way to access the every address in the memory may not be simple.

In many memory systems, the entire memory systems may be divided into rows and columns such that memory bits get row and column addresses that can be combined into a general memory address. Addresses may map to specific activations of rows and columns in the memory systems in order to access the bits on the selected rows and columns. However, generally there are more row and column lines in a memory system than bits in an address field. Thus, encoding and decoding of memory addresses in order to access every row and column in a memory system is common in many types of memory systems.

The electronics and organizations used for memory address encoding present numerous challenges in creating improved memory systems.

SUMMARY OF THE INVENTION

A number of embodiments are described herein.

According to a first embodiment, a circuit includes a decode logic circuit and a buffer coupled to the decode logic. A positive level shifter has an input coupled to receive address signals and an output coupled to the buffer. A negative level shifter has an input coupled to receive the address signals and an output coupled to the buffer.

According to a second embodiment, a method of decoding an address includes receiving an address signal at a positive level shifter and at a negative level shifter. A positive level shifted address signal is sent from the positive level shifter to a buffer and a negative level shifted address signal is sent from the negative level shifter to the buffer. A level shifted address signal is sent from the buffer to decode logic. The level shifted address signal is determined from the positive and negative level shifted address signals.

According to a third embodiment, a decoder includes a positive level shifter, a negative level shifter, and a control circuit coupled to the negative level shifter. The positive level shifter is configured to receive an address signal and provide a positive level shifted address signal to a buffer. The negative level shifter is configured to receive the address signal and provide a negative level shifted address signal to the buffer. The positive and negative level shifters are configured to operate in parallel and the control circuit is configured to disable the negative level shifter during read operations on a memory.

According to a fourth embodiment, a circuit includes a positive level shifter with an address input and a positive level shifted output and a negative level shifter with an address input and a negative level shifted output. The positive level shifter is coupled between a high positive voltage supply and a reference supply and the negative level shifter is coupled between a positive voltage supply and a negative voltage supply. The circuit also includes a buffer coupled to the positive level shifter and to the negative level shifter. The buffer has a level shifted address output and is coupled between the high positive voltage supply and the negative voltage supply.

According to a fifth embodiment, a method of decoding an address in a memory includes receiving an address signal at a positive level shifter and at a negative level shifter and providing a positive elevated address signal from the positive level shifter to a buffer. During a first operation in the memory, the method also includes providing a negative elevated address signal from the negative level shifter to the buffer. During a second operation in the memory, the method includes providing a first clamped reference voltage from the negative level shifter to the buffer. The method also includes providing a buffered and elevated address signal from the buffer to a decode logic circuit.

Other embodiments are described herein.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 illustrates a logic circuit diagram of input block used in an embodiment memory system;

FIG. 8 illustrates a table of voltages variables for an embodiment decoding system;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely memory systems, and more particularly, word line drivers for memory systems. Some of the various embodiments described herein include decoders, pre-decoders, level shifters and elevators, and memory operations. In other embodiments, aspects may also be applied to other applications involving any type of circuit or decoder according to any fashion as known in the art.

Various memory systems are capable of executing a number of instructions. As an example embodiment, a flash memory system generally operates with read, write, erase, and verify operations, although others may be introduced. As memory systems are used in more and more demanding applications and computing generally pushes for faster operational speeds, various embodiments include operations with improved speed. Specifically, in many embodiment memory systems, the read operation is performed more often than the other operations and is more influential over the overall operational speed of the memory system. For example, user experience is generally most affected by how quickly data in memory can be accessed or processed in order to generate output signals (values, graphics, information, etc.). Thus, embodiments described herein present memory systems with a shortened read path.

According to various embodiments described herein, a memory system includes positive and negative level shifters or elevators coupled to buffers, decode logic, and word line drivers. The memory system is organized such that the negative elevators, which receive address signals and shift the low voltage of the signal from ground to a negative value, are only used during erase or verify operations. Thus a read operation will only use the positive level shifters, which receive address signals and shift the high voltage of the signal from VDD to a more positive value VX, and the path through the negative level shifters will be bypassed. Thus, read operations may be performed more quickly because the delay path in the case of read operations is shortened.

Figure 1:
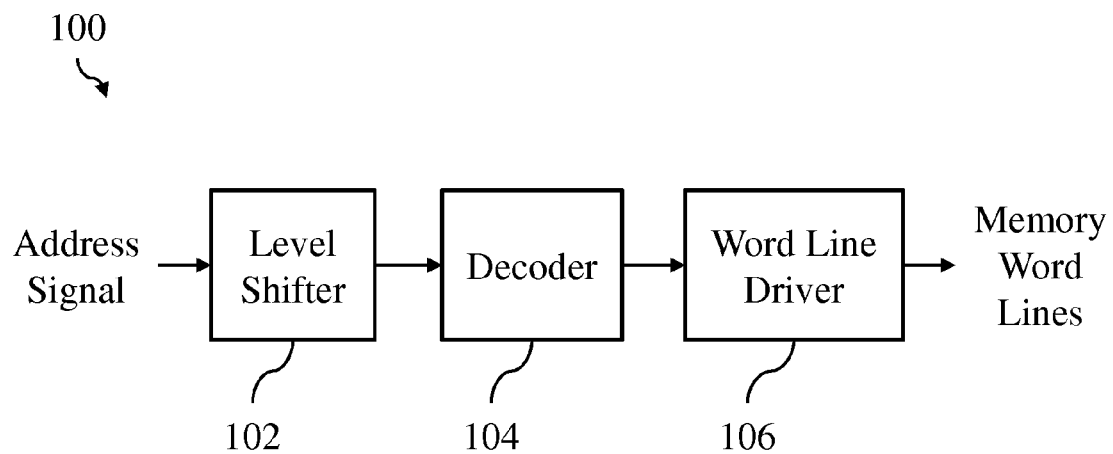
FIG. 1 illustrates a block diagram of an embodiment decoding system.

FIG. 1 illustrates a block diagram of an embodiment decoding system 100 including level shifter 102, decoder 104, and word line driver 106. According to various embodiments, an address signal is received by level shifter 102. The address signal may be a digital logic value having a specific and defined voltage range compatible with digital logic operations. The specific values of the range may include any voltages depending on the digital logic being used. Such an address signal is used as the select signal for a specific item. For example, the address signal may be a select signal for a word line or a number of word lines in a memory, such as a flash memory. In various embodiments, before the address signal can directly select the word line, the address signal is usually decoded and the voltage is shifted to a driving voltage through a voltage elevator or a level shifter.

Thus, in the embodiment shown, level shifter 102 receives the address signal and elevates the digital logic value to a new voltage range for driving the word line. According to various embodiments, the output of level shifter 102 depends on the operation being performed. For example, in a memory system during a read operation, level shifter 102 outputs positive elevated signals that have the upper voltage raised from a first positive voltage (VDD) to a high positive voltage (VX). During a verify operation performed on the memory, level 102 outputs negative elevated signals that have the lower voltage lowered from a first reference (GND) to a negative voltage (VNEG). According to various embodiments, level shifter 102 includes parallel paths for the positive and negative elevators such that the negative elevator may be bypassed during a read operation, for example. In such embodiments, bypassing the negative elevator may decrease the critical path during various operations, such as a read operation in a memory, and increase the system performance.

The elevated signal is decoded in decoder 104. Generally, an address signal has fewer bits than there are word lines in the memory and, thus, decoding is used. For example, a 4-bit address signal may be used to select 16 ($2^4$) word lines through decoding. In such an example embodiment, decoder 104 takes the 4-bit elevated address signal from level shifter 102 and provides 16 elevated drive signals.

According to various embodiments, decoder 104 is generally not used to drive the word lines directly. Instead, word line driver 106 receives the 16 elevated drive signals from decoder 104 and provides buffer or drive circuits for each of 16 word lines in a memory. In various embodiments, any number of bits may be used as an input signal and any number of drivers may be coupled to any number of word lines. For example, an 8-bit address is capable of selecting 256 word lines and a 32-bit address is capable of selecting about 4 billion word lines ($2^{32}$). In various embodiments, as will be described further below, an address signal may be partially used for the word line select and partially used for a bit line select.

Figure 2:
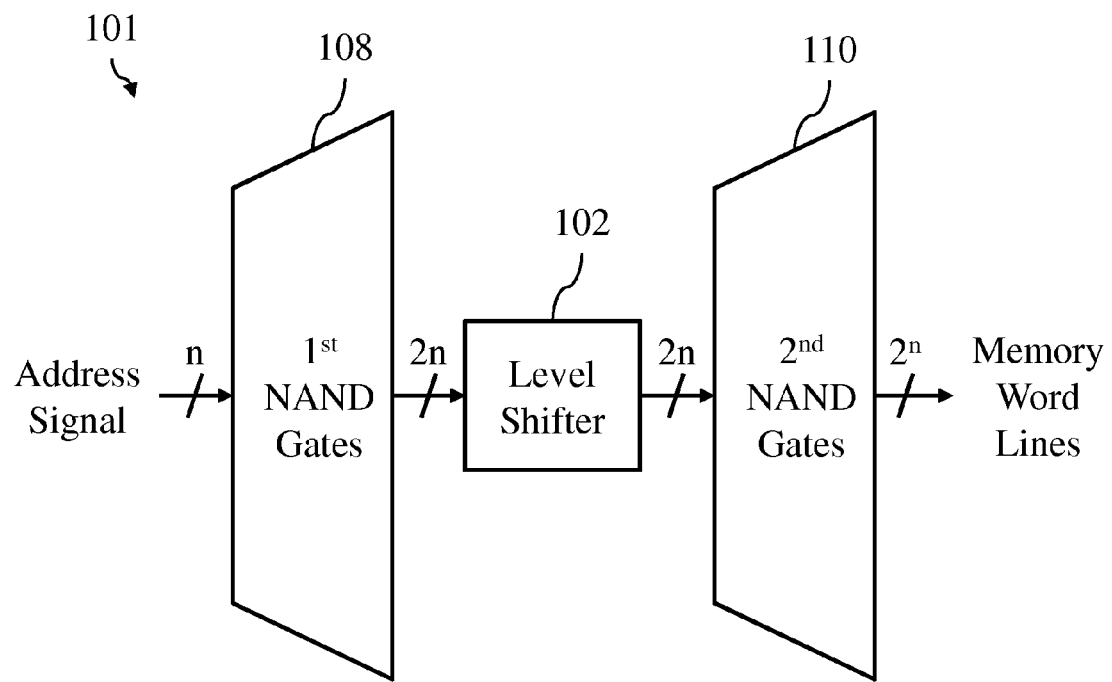
FIG. 2 illustrates a block diagram of another embodiment decoding system.

FIG. 2 illustrates a block diagram of another embodiment decoding system 101 including an implementation of the decoding scheme with pre-decoding. According to various embodiments, an n-bit address signal is received at a $1^{st}$ set of NAND gates 108. NAND gates 108 are used to generate 2-n pre-decoded signals that are supplied to level shifter 102. Level shifter 102 elevates the voltages of the 2-n pre-decoded signals to positive and, during some operations, negative levels as described further above and below in accordance with various embodiments. The 2-n pre-decoded and elevated signals are then sent to a $2^{nd}$ set of NAND gates 110 that perform full decoding to select the $2^n$ word lines as shown. In various embodiments, NAND gates 110 are an implementation of one type of decoding and NAND gates 108 serve to pre-decode the address signal.

Figure 3:
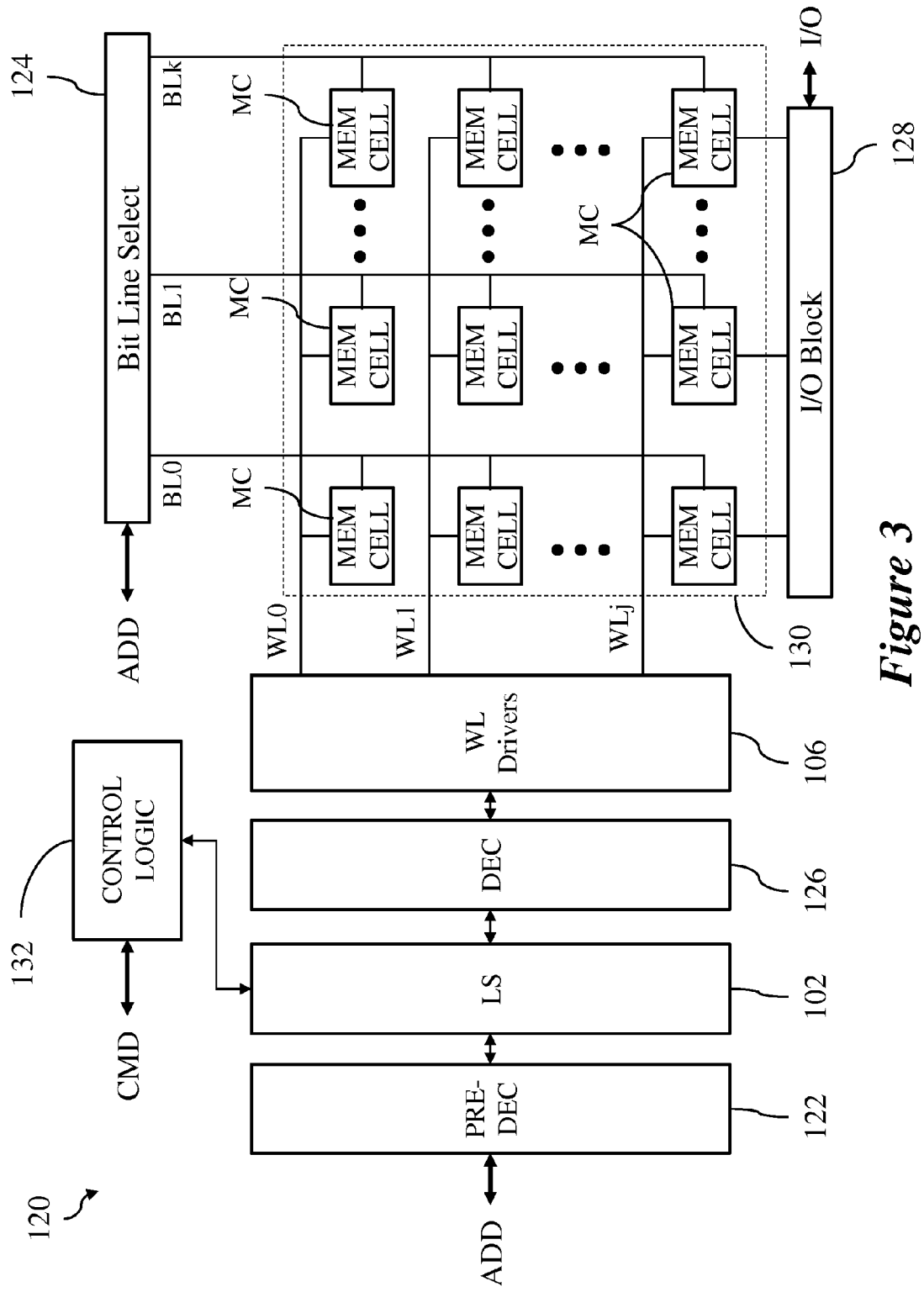
FIG. 3 illustrates a block diagram of an embodiment memory system.

FIG. 3 illustrates a block diagram of an embodiment memory system 120 including pre-decoder 122, level shifter 102, decoder 126, word line drivers 106, and memory array 130. According to various embodiments, address signal ADD is received at pre-decoder 122. Pre-decoder 122 performs a pre-decode operation, such as a first set of NAND operations by NAND gates 108, and conveys pre-decoded signals to level shifter 102. As described above, level shifter 102 elevates the logic voltages from the pre-decoded address signal to high positive and negative, during some operations, driving voltages according to embodiments described further below. The elevated and pre-decoded address signals are then fully decoded by decode block 126 and supplied to word line drivers 106.

In various embodiments, word line drivers 106 are coupled to the word lines WL0-WLj of memory array 130. As shown, memory array 130 includes individual memory cells MC arranged in an array. In various embodiments, the memory array may be arranged in any configuration as is known in the art. Also coupled to each memory is a bit line from bit lines BL0-BLk that are provided by bit line select 124. Each memory cell MC is also coupled to input/output (I/O) block 128 that provides signals for the I/O bus.

According to various embodiments, control logic 132 is coupled to level shifter 102 in order to provide control signals during different operations on memory array 130. As mentioned, embodiments include positive and negative voltage elevation circuits coupled in parallel within level shifter 102. Control logic 132 operates to enable and disable the negative elevator circuits depending on the memory operation performed. For example, during a read operation the negative elevator circuits may be disabled.

In various embodiments, a memory system such as memory system 120 may have numerous other control and processing blocks as well as being organized in different manners. Embodiments include a level shifter with voltage elevation performed in parallel and elevator circuits configured to be by-passed in various memory operations.

Figure 4:
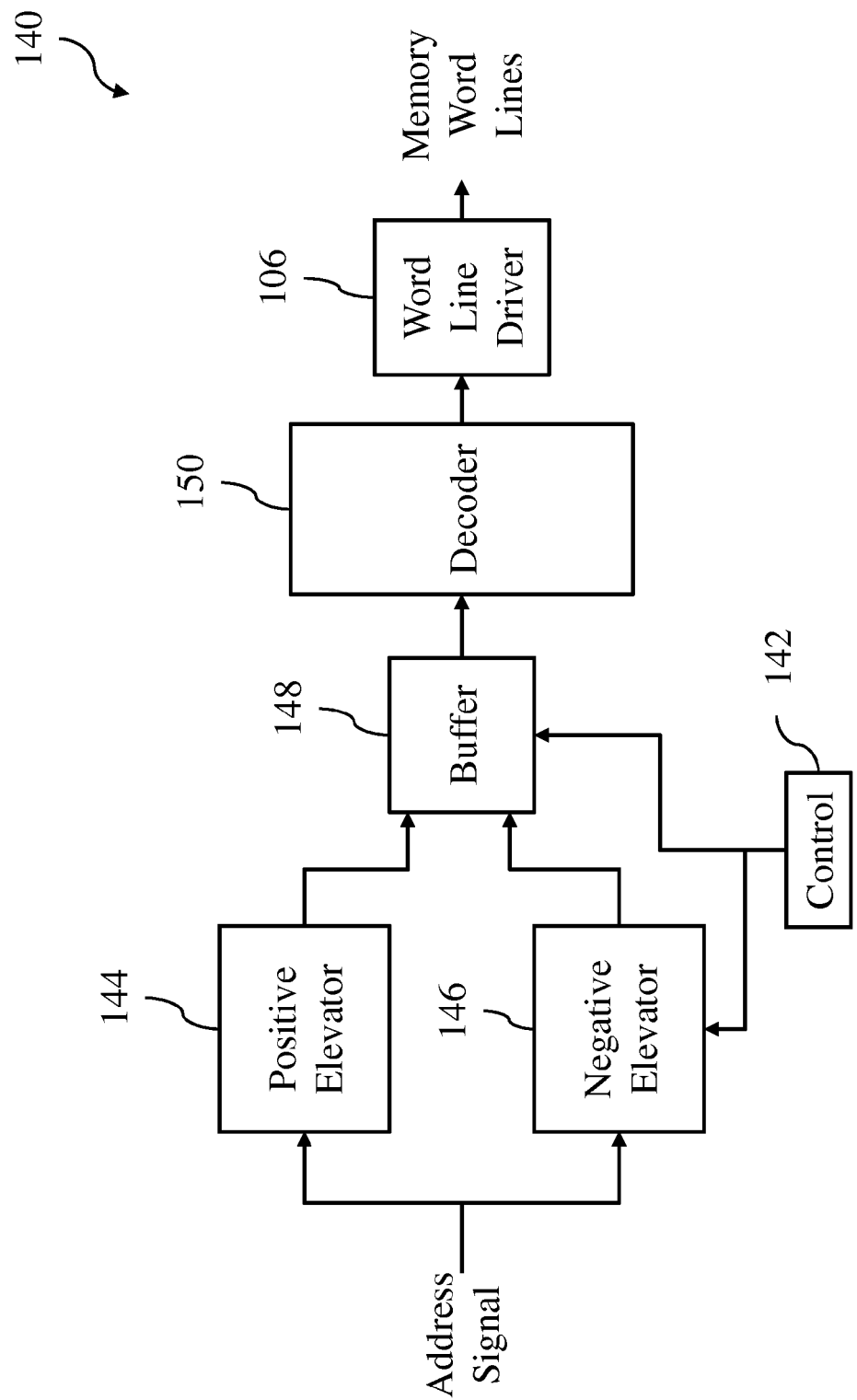
FIG. 4 illustrates a block diagram of a further embodiment decoding system.

FIG. 4 illustrates a block diagram of a further embodiment decoding system 140 including controller 142, positive elevator 144, negative elevator 146, buffer 148, decoder 150, and word line driver 106. According to various embodiments, both positive and negative elevators 144 and 146 receive an input address signal. In some embodiments, the address signal may be a pre-decoded address signal from a pre-decoder.

In the various embodiments, the address signal may have a digital logic voltage range between a reference voltage and a positive supply voltage, such as between GND and VDD, for example. Positive elevator 144 receives the address signal and elevates the voltage such that the output of positive elevator 144 has a voltage range between the reference voltage GND and a high positive voltage VX, which is a higher voltage than VDD. Similarly, negative elevator 146 receives the address signal and elevates the voltage such that the output of negative elevator 144 has a voltage range between a negative voltage VNEG and the positive supply voltage VDD.

The outputs of positive and negative elevators 144 and 146 are coupled to buffer 148. Depending on the logical values of the address signal, buffer 148 selects which type of signal to drive and supplies an elevated signal with a voltage range between VX and GND or between VX and VNEG to decoder 150. Decoder 150 completes the decode steps and supplies an elevated and decoded signal to word line driver 106, which drives the select word lines in a memory with the elevated voltage signals without driving the unselected word lines in the memory.

According to various embodiments, negative elevator 146 and buffer 148 receive control signals from control circuit 142. As mentioned above, during different operations on a memory system, the negative elevated voltage may not be necessary. For example, during read or program operations negative elevator 146 may be disabled or clamped to a specific voltage by receiving control signals from control circuit 142. In such embodiments, buffer 148 may also receive control signals from control circuit 142 during read or program operations such that negative elevator 146 is effectively bypassed and the output of buffer 148 has a voltage range between high positive voltage VX and reference voltage GND. During verify or erase operations, control circuit 142 may function to provide different control signals to negative elevator 146 and buffer 148 in order to enable negative elevator. In such embodiments, negative elevator 146 functions as described previously to negatively elevate the address signal such that the output of buffer 148 has a voltage range between negative voltage VNEG and high positive VX.

According to various embodiments, both negative voltage VNEG and high positive voltage VX may receive multiple different voltage levels from further voltage supply circuits (not shown) as is known in the art. In various embodiments, the different operations may require multiple values for high voltage and negative voltage. For example, the negative voltage VNEG during an erase operation may be a most negative value and the negative voltage VNEG during a verify operation may be a less negative value. Example values are described in reference to the example voltages depicted in the table of FIG. 8.

Figure 5:
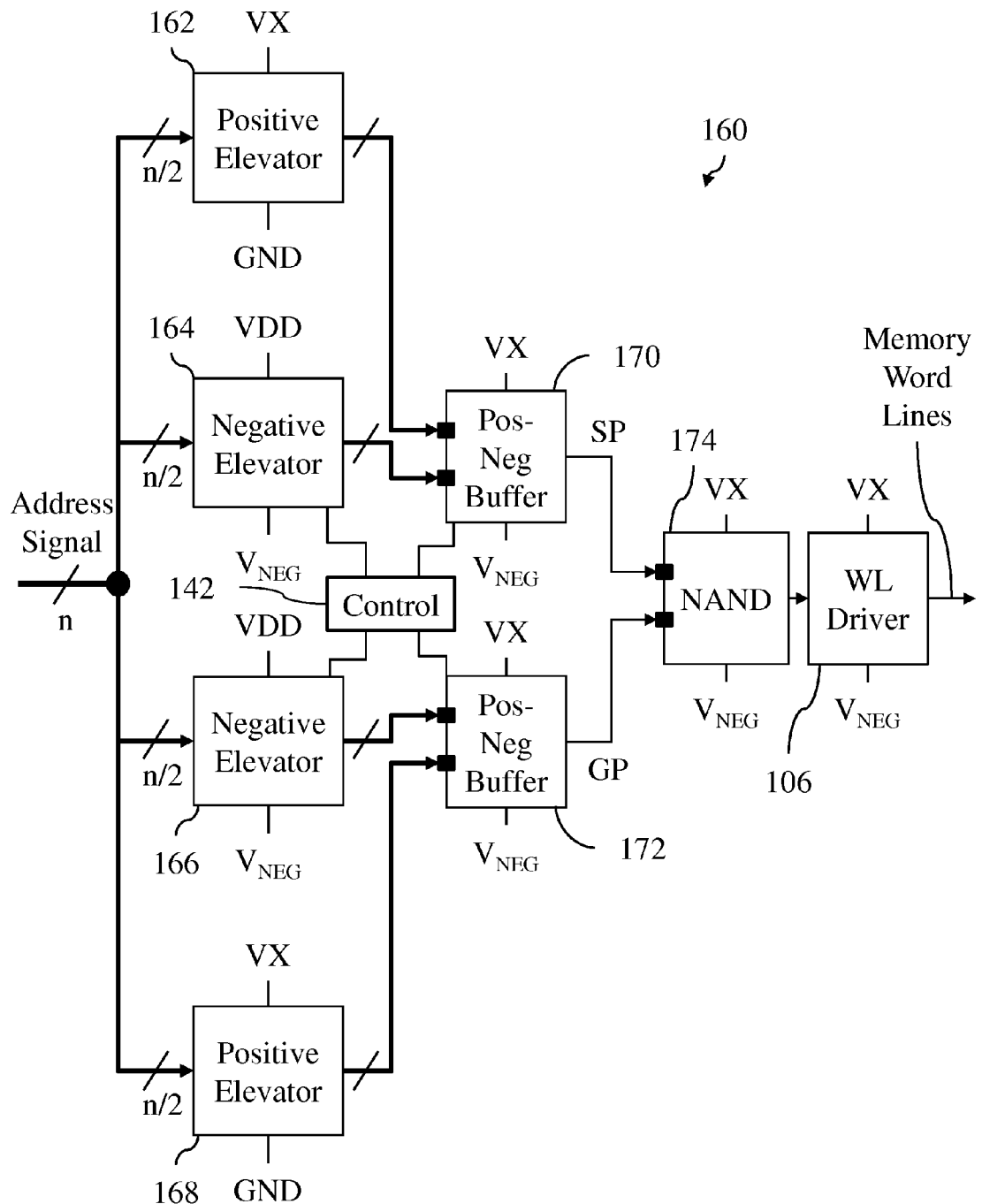
FIG. 5 illustrates a block diagram of still another embodiment decoding system.

FIG. 5 illustrates a block diagram of still another embodiment decoding system 160 including positive and negative elevators 162-168, positive-negative buffers 170 and 172, NAND gates 174, and word line drivers 106. According to various embodiments, decoding system 162 receives an address signal at an input. In some embodiments, the address signal is a pre-decoded address signal. The n-bit address signal is split in half with a first group of n/2 bits going to positive and negative elevators 162 and 164 and a second group of n/2 bits going to positive and negative elevators 166 and 168.

In various embodiments, negative elevators 164 and 166 receive the address signal with a voltage between reference GND and supply VDD and output a voltage between negative VNEG and supply VDD. Similarly, positive elevators 162 and 168 receive the address signal with a voltage between reference GND and supply VDD and output a voltage between reference GND and high supply VX. The voltages from positive and negative elevators are combined at positive-negative buffers 170 and 172 such that the output of positive-negative buffers 170 and 172 is between negative VNEG and high supply VX.

The output SP from positive-negative buffer 170 and the output GP from positive-negative buffer 172 are then received by NAND gates 174 for final decoding. The fully decoded and elevated word line select signals are provided from NAND gates 174 to word line driver 106. Based on these signals, word line driver 106 drives the memory word lines of a memory, such as memory array 130 as described in reference to FIG. 3.

According to various embodiments, controls signals from control circuit 142 may disable or clamp negative elevators 164 and 166 during some types of system operation as described above. When control circuit 142 provides disable signals to negative elevator 164 and positive-negative buffer 170 and negative elevator 166 and positive-negative buffer 172, respectively, the outputs SP and GP may be constrained to a voltage range between reference GND and high supply VX. During such operations, negative elevators 164 and 166 may be bypassed and the output signals may be clamped, such as to supply VDD, for example.

Figure 6:
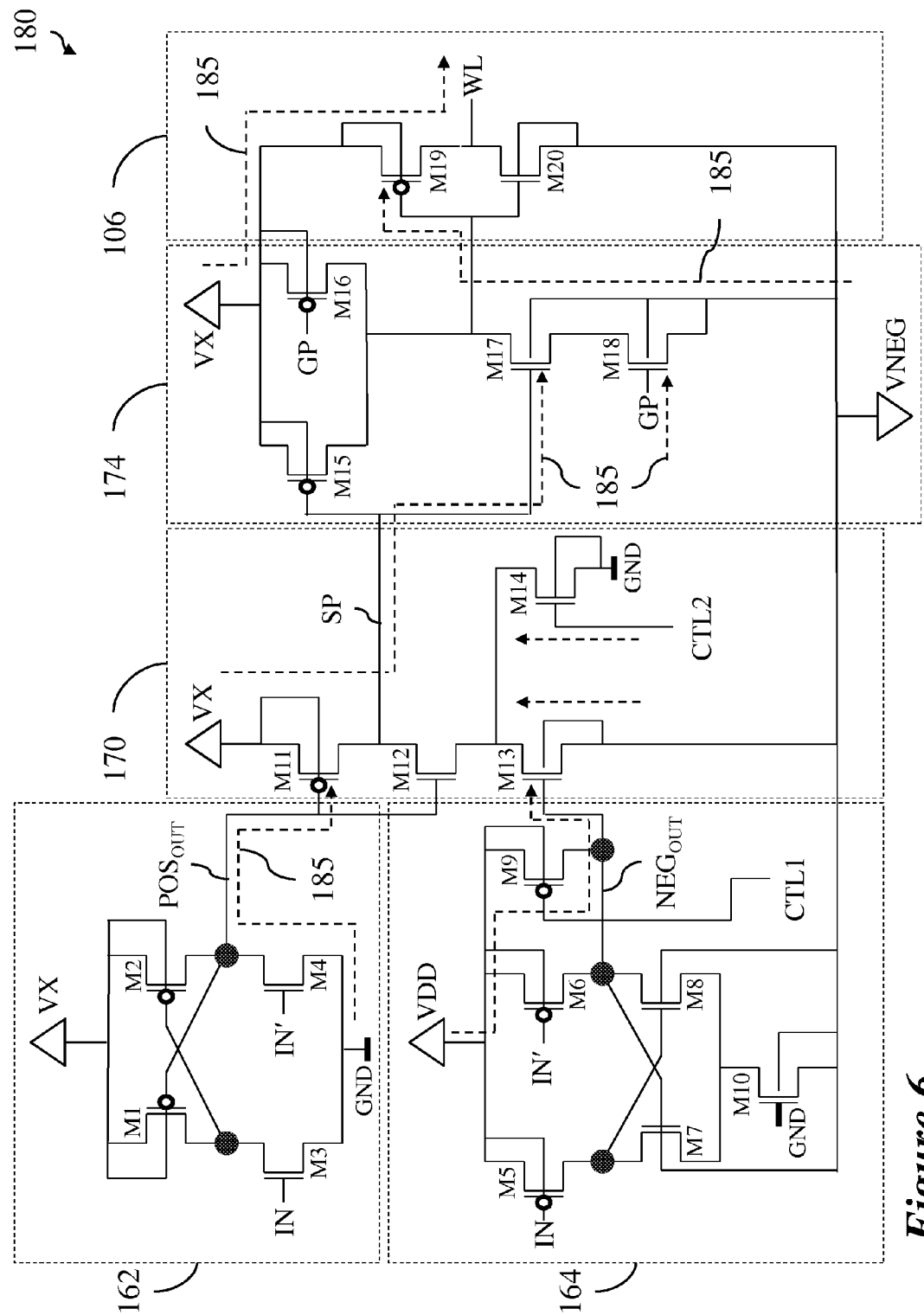
FIG. 6 illustrates a circuit diagram of an embodiment decoding system.

In the various embodiments described above, various signals are shown as bus-lines in some embodiments and as single lines in others. According to various embodiments, the bus lines are illustrated in order to show that multiple decode circuits may be implemented in parallel. In various embodiments, a word line driver is coupled to every word line in memory. In such embodiments, each word line is coupled to a final logic gate in a decoder and the decoder includes an output for each word line. Positive and negative elevators 162-168 and positive-negative buffers 170 and 172 may be implemented as numerous circuits in parallel in order to elevate multiple lines and supply multiple SP and GP outputs to the decoder. The circuit illustrated in the following FIG. 6 illustrates a single elevator circuit and decode step for a single line. In a physical implementation, each memory line may include such a circuit.

FIG. 6 illustrates a circuit diagram of an embodiment decoding system 180 including embodiment circuit implementations of positive elevator 162, negative elevator 164, positive-negative buffer 170, NAND gate 174, and word line driver 106. According to various embodiments, transistors M1-M20 are arranged to implement decoding system 180 with all the blocks described previously. Positive elevator 162, negative elevator 164, and positive-negative buffer 170 generate output SP and another identical circuit is used to generate output GP as shown in FIG. 5 above. The generation of output GP for decoding is not illustrated in order to preserve clarity in the circuit diagram.

In various embodiments and as described previously, positive elevator 162 and negative elevator 164 are coupled in parallel to positive-negative buffer 170. Control signals CTL1 and CTL2, which may originate from control circuit 142 for example, enable and disable negative elevator 164 and control positive-negative buffer 170 during different operations. For example, in embodiments involving word line decoding for a memory system, control signals CTL1 and CTL2 are set to different values during different memory operations. In various embodiments, during a read or program (i.e., write) operation on the memory, CTL1 and CTL2 may be set to clamp the output $NEG_{OUT}$ of negative elevator 164 to VDD; during an erase operation on the memory, CTL1 and CTL2 may be set to clamp output $NEG_{OUT}$ to GND; and during a verify operation on the memory, CTL1 and CTL2 may be set to allow output $NEG_{OUT}$ to range between VDD and VNEG based on input IN. Example voltages values for control signals CTL1 and CTL2 are shown in FIG. 8.

In the various embodiments, transistors M1-M4 implement positive elevator 162 by generating an elevated output signal $POS_{OUT}$ between voltages VX and GND based on input signals IN and IN'. Similarly, transistor M5-M10 implement negative elevator 164 by generating an elevated output signal $NEG_{OUT}$ between voltages VDD and VNEG based on inputs IN and IN'. In such embodiments, transistor M9 clamps output $NEG_{OUT}$ during read, program, and erase operations and allows voltage elevation based on inputs IN and IN' during verify operations.

According to various embodiments, transistors M11-M14 implement positive-negative buffer that selects between outputs $POS_{OUT}$ and $NEG_{OUT}$ during operation. A grounding circuit, implemented in this example by transistor M14, functions to supply a more stable ground GND to the internal node between transistors M12 and M13 in specific operations based on control signal CTL2. Transistors M15-M18 implement NAND gate 174 with inputs from outputs SP and GP, where output GP being generated in a circuit (not shown) similar to the circuit shown for positive elevator 162, negative elevator 164, and positive-negative buffer 170. Finally, transistors M19 and M20 implement word line driver 106 as an inverter coupled to the output of NAND gate 174. In various embodiments, output WL is supplied to the selected word line of the memory system and the read, program, erase, or verify operation is executed via the drive signal on output WL.

In the interest of clarity, decoding system 180 is described herein with respect to a read operation. In such an example, logic input IN=0 is supplied to transistors M3 and M5 and, consequently, logic input IN'=1 is supplied to transistors M4 and M6. The resulting signal path is illustrated as signal path 185. As mentioned previously, the logical inputs IN and IN' may have a standard logic voltage range, such as between 0 and 3.3 V, depending on the technology used. Based on these inputs, in positive elevator 162 transistor M3 is off, transistor M4 is on, transistor M1 is on, and transistor M2 is off. The result is that output $POS_{OUT}$ has a voltage of 0 V and turns transistor M11 on, as shown by signal path 185.

Concurrently, in negative elevator 164 transistor M5 is on, transistor M6 is off, transistor M7 is off, and transistor M8 is on, but because transistor M9 is switched on by control signal CTL1, output $NEG_{OUT}$ is clamped to VDD and transistor M10 with drive signal GND prevents transistor M8 from conflicting with the clamping caused by transistor M9. Because output $NEG_{OUT}$ is clamped to VDD, transistor M13 is switched on and couples voltage VNEG to transistor M12. As described further below in reference to FIG. 8, the reference supply voltages VX, VDD, and VNEG are set to different values during different memory operations, as is known in the art. Thus, in a read operation, VNEG may be set to GND. In such embodiments, transistors M13 and M14 are both switched on during a read operation and supply a stable ground voltage GND to transistor M12.

As shown by signal path 185, high positive voltage VX is supplied to transistor M17 and, from a separate GP generation circuit (not shown), to transistor M18. Both transistors M17 and M18 are switched on and voltage VNEG, which is ground voltage GND during a read operation, is supplied to switch transistor M19 on. Finally, high positive voltage VX is driven through transistor M19 on output WL. During such a read operation, if logic input IN=1 is supplied to positive elevator 162, output WL drives voltage VNEG (i.e., GND during a read operation) based on a signal path different from 185. In such an embodiment, output $NEG_{OUT}$ remains clamped to voltage VDD. In the interest of brevity, further signals paths during other operations on the memory system should be inferred based on voltages given by FIG. 8.

FIG. 7 illustrates a logic circuit diagram of an embodiment input stage 190 used in an embodiment memory system. Input stage 190, which could provide the signal IN of FIG. 6, includes NAND gate 192 and inverter 194 (or simply an AND gate). According to various embodiments, input stage receives two predecoder signals PRE<0>, PRE<1>, and a bit of the address (the least significant bit LSB in this particular example) and generates output IN for decoding system 180. The predecoder signals PRE<0>, PRE<1> indicate which of a number of pre-decoded signal sets are to be used. When the two signals are both active (high in this case), the address signal LSB will be passed to the node IN.

FIG. 8 illustrates a table 199 of voltage variables for an embodiment decoding system shown during different memory operations. According to various embodiments, each memory operation may produce and use different voltages at different points in the embodiment decoding systems described herein. Table 199 includes voltage variables during memory operations including read, program, verify, and erase. Voltage variables for high positive VX, negative VNEG, and positive VDD supplies, are shown in the first group of columns for each operation. Voltage variables for control signals CTL1 and CTL2 are shown in the next pair of columns for each operation. Finally, the last three columns show example output voltages variables for outputs SP, GP, and WL.

According to various embodiments, program voltage $V_{prog}$ is a voltage level supplied to a selected word line during read or program operations. Selected verify voltage $V_{veri\_s}$ is a voltage level supplied to a selected word line during verify operations. Non-selected verify voltage $V_{veri\_n}$ is a voltage level supplied to a non-selected word line during verify operations. Erase voltage $V_{erase}$ is a voltage level supplied to a selected word line during erase operations. Supply voltage $V_{sup}$ is a typical supply voltage for a circuit VDD terminal. Reference voltage $V_{ref}$ is a typical reference voltage for a circuit reference terminal, such as ground GND for example. In various embodiments, all the voltages variables listed may take any value in different embodiments depending on the system organization and technology being used for the circuits and memory system. For example, all the voltage variables listed may range between −15 V and 15 V for different technologies and designs.

In some specific embodiments, program voltage $V_{prog}$ ranges between 7 V and 12 V; selected verify voltage $V_{veri\_s}$ ranges between 7 V and 12 V; non-selected verify voltage $V_{veri\_n}$ ranges between −2 V and −10 V; erase voltage $V_{erase}$ ranges between −7 V and −12 V; supply voltage $V_{sup}$ ranges between 2.2 V and 5 V; and reference voltage $V_{ref}$ ranges between −2.2 V and 2.2 V. In a particular embodiment, supply voltage $V_{sup}$ is 3.3 V and reference voltage $V_{ref}$ is 0 V.

According to various embodiments, table 199 shows that the supplies VX, VNEG, and VDD are not constant for every memory operation. As is known in the art, the supply voltages may be scaled for specific operations (e.g., erase and verify). Such scaling is performed by circuits outside the decoding path disclosed herein and may receive control signals similar or related to control signals CTL1 and CTL2.

Figure 9:
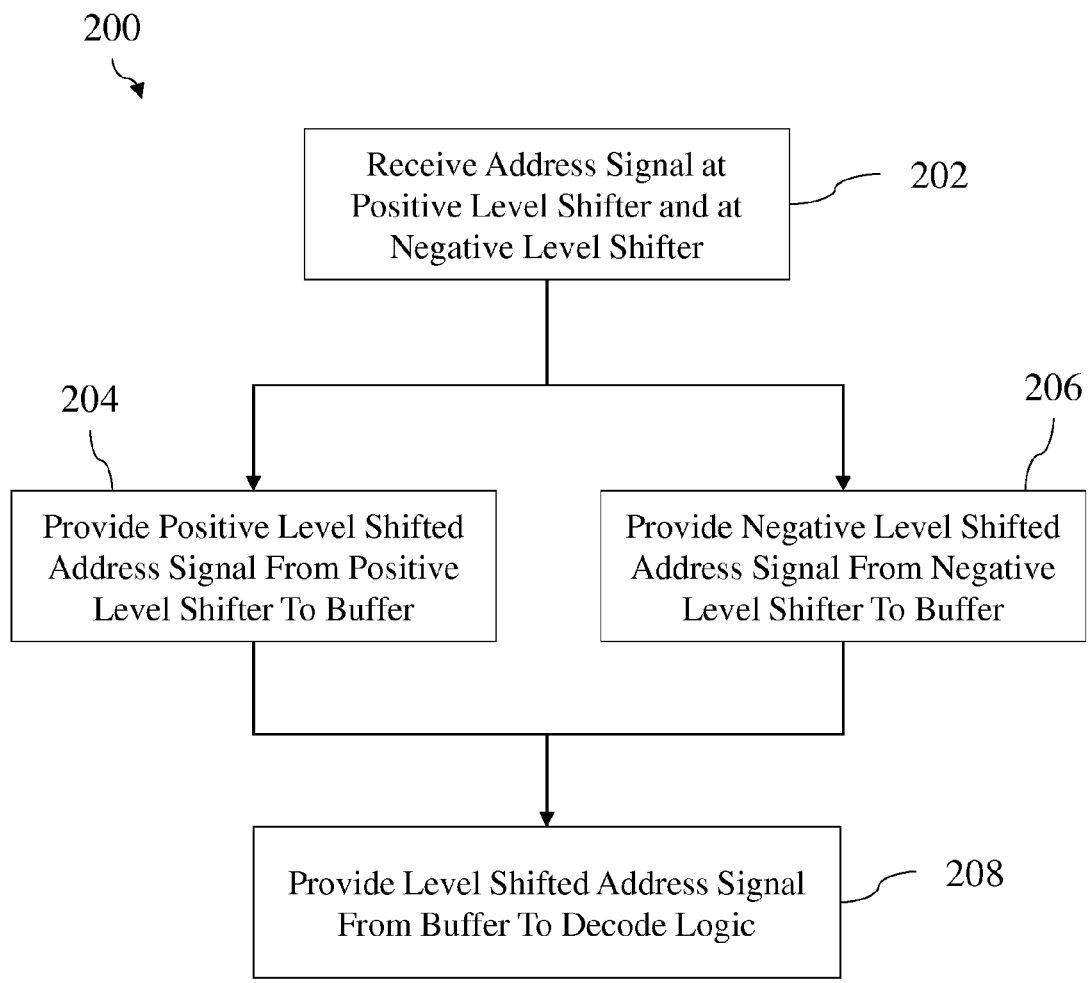
FIG. 9 illustrates a method of operation of an embodiment decoding system.

FIG. 9 illustrates a method of operation 200 of an embodiment decoding system including steps 202-208. According to various embodiments, step 202 includes receiving an address signal at a positive level shifter and at a negative level shifter. The positive and negative level shifters may be coupled in parallel and may operate in parallel. As described previously, the positive and negative level shifters may be controlled depending on the operations performed. In some specific embodiments, the negative level shifter may be disabled or clamped during certain operations, such as during specific memory operations for a word line decoding system in a memory.

Following step 202, step 204 includes providing a positive level shifted address signal from the positive level shifter to a buffer. Further, step 206 includes providing a negative level shifted address signal from the negative level shifter to the buffer. In various embodiments, the buffer may select one of the level shifted address signals from the positive or negative level shifters. In some embodiments, each bit is supplied to a separate bitwise level shifter and the buffer receives a single line signal from each of the positive and negative level shifters. In such embodiments, the signals may control the buffer to select a positive voltage or a low voltage, where the positive voltage may be regular positive or high positive and the low voltage may be a ground voltage or a negative voltage in different embodiments.

In step 208, a level shifted address signal is provided from the buffer to decode logic. The level shifted address signal may be determined from the positive and negative level shifted address signals. As mentioned above, the buffer may receive numerous single bit signals from multiple level shifters, each pair of signals from a positive and negative level shifter being combined at the buffer and a single corresponding output supplied to a decode circuit. In such embodiments, the decode logic may also receive multiple inputs from similar buffers and perform decoding to drive specific lines. In one embodiment, a pair of specific lines may be combined at the decode logic by a NAND gate that is coupled to a word line driver for a memory, for example. In alternative embodiments, the steps of method of operation 200 may be rearranged according to any order.

Figure 10:
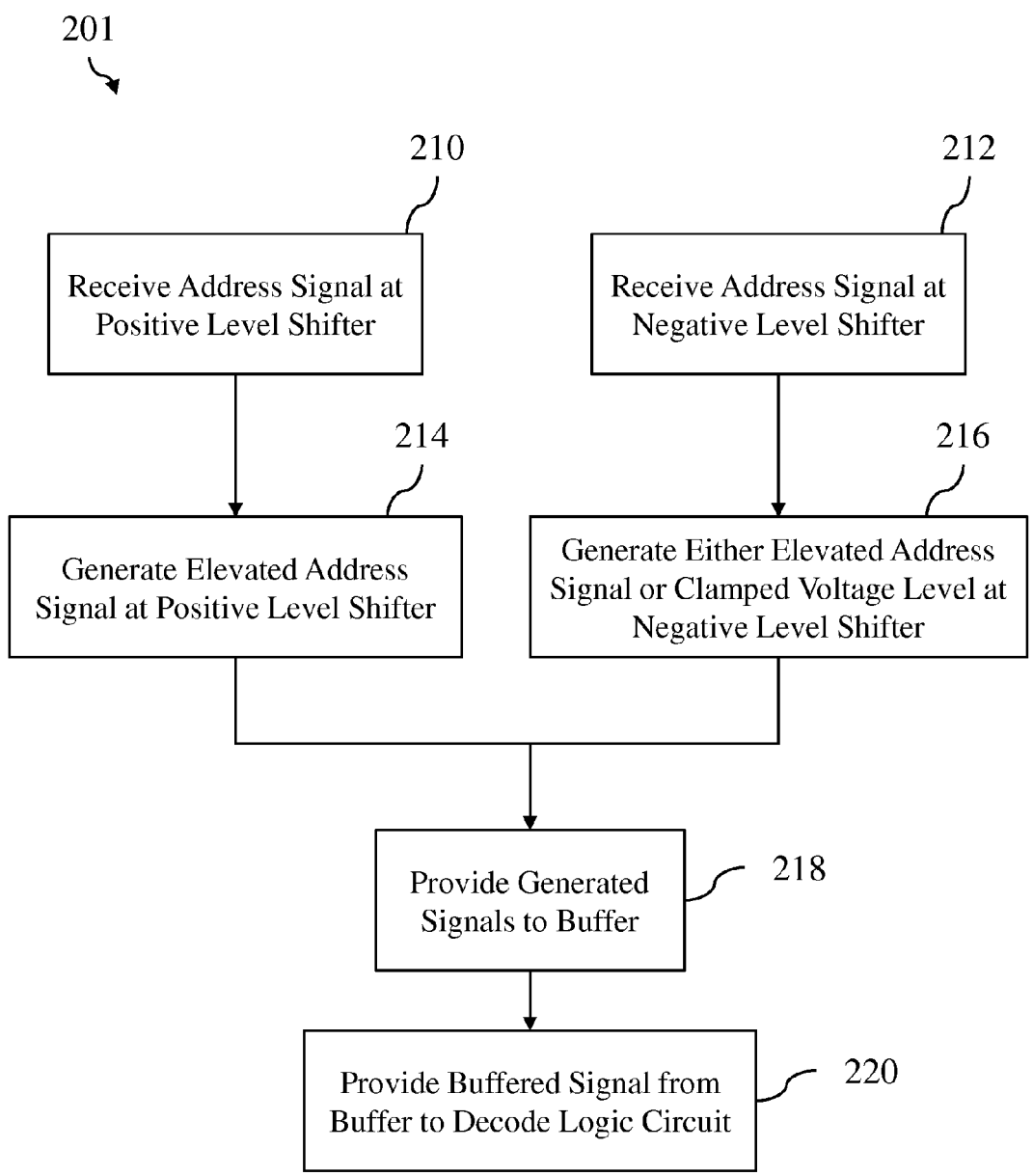
FIG. 10 illustrates a method of operation of another embodiment decoding system.

FIG. 10 illustrates a method of operation 201 of another embodiment decoding system including steps 210-220. According to various embodiments, steps 210 and 212 include receiving an address signal at positive and negative level shifters. Based on the received address signal, step 214 includes generating a positive elevated address signal at the positive level shifter. Step 216 includes generating either a negative elevated address signal or a clamped voltage level at the negative level shifter. In step 216, the negative elevated address signal is generated during a first operation (or set of operations) of the memory and the clamped voltage level is generated during a second operation (or set of operations) of the memory. The negative elevated address signal is based on the received address signal from step 212 while the clamped voltage level is independent from the received address signal.

As illustrated by step 218, the generated signals are provided to the buffer. In this embodiment, the generated signals would include the elevated address signal from the positive level shifter and either the elevated address signal or the clamped voltage level from the negative level shifter. The buffered signal can then be provided to a decode logic circuit, as illustrated by step 220.

In various embodiments, step 216 illustrates operations that depend on the operation within the memory. For example, the elevated signal can be generated during an erase operation or a verify operation and the clamped voltage level can be generated during a read operation or a program operation (i.e., writing a value to a memory cell). Based on the elevated address signals from steps 214 and 216, steps 218 and 220 include providing a buffered and elevated address signal from the buffer to a decode logic circuit. The decode logic circuit may perform final decoding in order to select word lines in the memory for driving. Thus, the decode logic may select and enable word line drivers for specific word lines.

In embodiments discussed above, the negative level shifter is disabled during certain operations while the positive level shifter is always operational. This particular combination is not necessary. In other embodiments, the positive level shifter is disabled during certain operations while the negative level shifter is always operational. In yet other embodiments, both the positive and negative level shifters are selectively enabled and disabled depending on the operation, i.e., whether the end operation needs level-shifted signals or not.

According to the various embodiments described herein, descriptions are presented in reference to pre-decoded address signals coupled to level shifters that are coupled to decoders. In various embodiments, the order of coupling is highly variable. Thus, in some embodiments, a level shifter according to the embodiments described herein receives an un-decoded address signal and elevates the signal before supplying it to a decoder that may or may not implement a pre-decoder. In other embodiments, any organization of level shifters and decoders may be implemented.

According to embodiments described herein, various advantages may include a decoder with a shortened delay path. According to embodiments, a decoder with positive and negative elevators may provide a level shifted signal through parallel elevators. The usage of parallel elevators may decrease the delay path and allow one of the elevators to be disabled or clamped during specific decoding operations.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a decode logic circuit;
a buffer coupled to the decode logic circuit;
a positive level shifter with an input coupled to receive address signals and an output coupled to the buffer, the positive level shifter coupled between a high positive voltage and a reference voltage;
a negative level shifter with an input coupled to receive the address signals and an output coupled to the buffer, the negative level shifter coupled between a low positive voltage and a negative voltage; and
an enable circuit coupled to the negative level shifter, the enable circuit configured to
during a first mode of operation, disable the negative level shifter and enable the positive level shifter, and
during a second mode of operation, enable the negative level shifter.

2. The circuit of claim 1, wherein the buffer is coupled between the high positive voltage and the negative voltage.

3. The circuit of claim 1, further comprising a pre-decoder coupled to receive first address signals and coupled to provided pre-decoded second address signals to the positive and negative level shifters.

4. The circuit of claim 3, wherein the pre-decoder and the decode logic circuit comprise NAND gates.

5. The circuit of claim 1, wherein the enable circuit is also coupled to a grounding circuit within the buffer, wherein the grounding circuit is configured to couple a terminal of the buffer to ground when enabled.

6. The circuit of claim 1, wherein the circuit comprises an address decoder for a memory, the memory comprising word lines coupled to memory cells.

7. The circuit of claim 6, wherein the memory comprises a non-volatile memory.

8. The circuit of claim 6, further comprising a word line driver coupled between the buffer and the word lines of the memory.

9. A method of decoding an address, the method comprising:
receiving an address signal at a positive level shifter and at a negative level shifter;
providing a positive level shifted address signal from the positive level shifter to a buffer;
providing a negative level shifted address signal from the negative level shifter to the buffer;
providing a level shifted address signal from the buffer to decode logic, wherein the level shifted address signal is determined from the positive and negative level shifted address signals; and
clamping an output of the negative level shifter to a first voltage during a read operation.

10. The method of claim 9, further comprising clamping the output of the negative level shifter to a second voltage during an erase operation.

11. The method of claim 9, further comprising providing the address signal to the positive and negative level shifters from a pre-decoder, wherein the address signal comprises a pre-decoded address signal.

12. The method of claim 11, further comprising:
providing a decoded address signal from the decode logic to a word line driver; and
driving word lines for a memory with the word line driver, wherein the word line driver selects which lines to drive based on the decoded address signal.

13. The method of claim 9, wherein the positive level shifted address signal comprises a first address signal having a voltage level between a high positive level and a reference level and the negative level shifted address signal comprises the first address signal having a voltage level between a low positive level and a negative level.

14. A decoder for a memory, the decoder comprising:
a buffer;
a positive level shifter configured to receive an address signal and provide a positive level shifted address signal to the buffer;
a negative level shifter configured to receive the address signal and provide a negative level shifted address signal to the buffer, wherein the positive and negative level shifters are coupled to operate in parallel; and
a control circuit coupled to the negative level shifter, wherein the control circuit is configured to disable the negative level shifter during read operations on the memory.

15. The decoder of claim 14, wherein:
the positive level shifter is coupled between a high positive voltage and a reference voltage and the positive level shifted address signal comprises a first address signal having a voltage level between the high positive voltage and the reference voltage; and
the negative level shifter is coupled between a low positive voltage and a negative voltage and the negative level shifted address signal comprises the first address signal having a voltage level between the low positive voltage and the negative voltage.

16. The decoder of claim 14, wherein the buffer is configured to provide an elevated and buffered address signal.

17. The decoder of claim 16, further comprising a decode circuit coupled to the buffer and configured to decode the elevated and buffered address signal.

18. The decoder of claim 14, wherein disabling the negative level shifter comprises clamping an output of the negative level shifter to a first voltage.

19. The decoder of claim 18, wherein the control circuit is further configured to cause the output of the negative level shifter to be clamped to a second voltage during erase operations on the memory.

20. The decoder of claim 14, wherein the buffer comprises a grounding circuit and the control circuit is also coupled to the grounding circuit.

21. The decoder of claim 20, wherein the grounding circuit comprises a switch coupled between an internal node of the buffer and a reference voltage and configured to provide a path between the internal node of the buffer and the reference voltage dependent on the control circuit.

22. A circuit comprising:
a positive level shifter comprising an address input and a positive level shifted output, wherein the positive level shifter is coupled between a high positive voltage supply and a reference supply;
a negative level shifter comprising an address input and a negative level shifted output, wherein the negative level shifter is coupled between a positive voltage supply and a negative voltage supply; and
a buffer coupled to the positive level shifter and to the negative level shifter and comprising a level shifted address output, wherein the buffer is coupled between the high positive voltage supply and the negative voltage supply; and a control circuit coupled to the negative level shifter, wherein the control circuit is configured to:
enable the negative level shifter during a first operation,
clamp the negative level shifted output to a first voltage during a second operation, and
clamp the negative level shifted output to a second voltage during a third operation.

23. The circuit of claim 22, further comprising a decoder coupled to the buffer and a driver coupled to the decoder.

24. The circuit of claim 22, wherein the buffer comprises a semiconductor switch coupled between the reference supply and an internal node of the buffer and configured to be enabled by the control circuit.

25. A method of decoding an address in a memory, the method comprising:
receiving an address signal at a positive level shifter and at a negative level shifter;
providing a positive elevated address signal from the positive level shifter to a buffer;
during a first operation in the memory, providing a negative elevated address signal from the negative level shifter to the buffer;
during a second operation in the memory, providing a first clamped reference voltage from the negative level shifter to the buffer; and
providing a buffered and elevated address signal from the buffer to a decode logic circuit.

26. The method of claim 25, further comprising:
decoding the buffered and elevated address signal at the decode logic circuit; and
driving word lines of the memory based on the decoded, buffered, and elevated address signals.

27. The method of claim 25, further comprising:
during a third operation in the memory, providing a second clamped reference voltage from the negative level shifter to the buffer.

28. The method of claim 25, wherein providing the first clamped reference voltage from the negative level shifter to the buffer comprises clamping an output of the negative level shifter to a reference voltage node.

29. The method of claim 25, wherein
the first operation in the memory comprises an erase operation in the memory or a verify operation in the memory, and
the second operation in the memory comprises a read operation in the memory or a program operation in the memory.

* * * * *